United States Patent
Braddell

(10) Patent No.: US 8,115,213 B2
(45) Date of Patent: Feb. 14, 2012

(54) SEMICONDUCTOR LIGHT SOURCES, SYSTEMS, AND METHODS

(75) Inventor: Jules Braddell, Cork (IE)

(73) Assignee: Phoseon Technology, Inc., Hillsboro, OR (US)

(*) Notice: Subject to any disclaimer, the term of this patent is extended or adjusted under 35 U.S.C. 154(b) by 638 days.

(21) Appl. No.: 12/028,516

(22) Filed: Feb. 8, 2008

(65) Prior Publication Data

US 2008/0191194 A1    Aug. 14, 2008

Related U.S. Application Data

(60) Provisional application No. 60/888,874, filed on Feb. 8, 2007.

(51) Int. Cl.
*H01L 33/00* (2010.01)

(52) U.S. Cl. ....... 257/79; 257/94; 257/103; 257/E33.01; 257/12; 257/14

(58) Field of Classification Search .............. 257/79, 257/103, E33.056, E33.01, 12, 14
See application file for complete search history.

(56) References Cited

U.S. PATENT DOCUMENTS

| | | | | |
|---|---|---|---|---|
| 6,580,099 B2 * | 6/2003 | Nakamura et al. | | 257/103 |
| 6,995,505 B2 | 2/2006 | Braddell | | |
| 6,999,486 B2 * | 2/2006 | Kuniyasu et al. | | 372/35 |
| 2003/0209717 A1 * | 11/2003 | Okazaki | | 257/80 |
| 2005/0231713 A1 | 10/2005 | Valentin | | |
| 2007/0272936 A1 * | 11/2007 | Shin | | 257/97 |

FOREIGN PATENT DOCUMENTS

JP        08213654 A   *  8/1996
WO    PCT/US03/014625      11/2003

* cited by examiner

*Primary Examiner* — Cuong Q Nguyen
*Assistant Examiner* — Tran Tran
(74) *Attorney, Agent, or Firm* — Marger Johnson & McCollom, P.C.

(57) ABSTRACT

A light-emitting diode includes a substrate, a lower cladding layer, an active layer having a quantum well of a thirty percent concentration of indium on the lower cladding layer, and an upper cladding layer. A method of manufacturing light-emitting diodes includes forming a lower cladding layer on a substrate, forming an active layer on the lower cladding layer such that the active layer has a quantum well of thirty percent indium, forming an upper cladding layer on the active layer, and forming a metal cap on the upper cladding layer.

10 Claims, 3 Drawing Sheets

SEMICONDUCTOR LIGHT SOURCES, SYSTEMS, AND METHODS

This application is a non-provisional of, and claims priority to, U.S. Provisional Application No. 60/888,874 filed Feb. 8, 2007.

BACKGROUND

The disclosure generally relates to light emitting semiconductor devices and systems. It particularly relates to systems used for IR inspection and imaging of single and bonded semiconductor substrates, MEMS (MicroElectro-Mechanical Systems) and MEMS-type constructions and bio-sensors.

A semiconductor light source, such as a light emitting diode, source with a peak wavelength operating in the 1.0 to 1.1 µm band is very useful for certain known and future applications. For example, the wavelength may be used for MEMs inspection or the ability to see through semiconductor wafers. The wavelength may be detected by certain detection means, such as standard hi-resolution CCD (charge-coupled device) arrays. The wavelength also has medical applications, for example, blood analysis of diabetics.

Current illuminators and literature in this area refer to laser diode sources for these applications. These are not ideal for this type of application as laser speckle, scatter and lack of uniformity cause difficulties for inspection type applications.

Current implementations use a strained InGaAs quantum well surrounded by GaAs cladding layers and have been well documented in the peer reviewed journals and in some patents. All references focus on the use of these structures for laser diode and not other semiconductor light sources, such as light emitting diode (LEDs) type illuminators, and certainly not in arrays of LEDs. Manufacture of arrays of laser diodes is not practical, making LEDs a more attractive implementation in which to achieve the desired wavelengths. However, as mentioned above attaining the desired wavelengths in a structure that can be manufactured in arrays creates some difficulties.

Another difficulty with the current designs arises in trying to extend the wavelength of the peak emission wavelength beyond 1 µm. To achieve this, the indium content of the InGaAs strained quantum well has to be increased and the quantum well thickness also increased. The thickness approaches the critical thickness for the quantum well. Thicknesses larger than the critical thickness causes defects in the layers, in turn leading to a relaxation of the lattice that may result in device failure and poor performance.

SUMMARY

One embodiment is a light-emitting diode includes a substrate, a lower cladding layer, an active layer having a quantum well of a thirty percent concentration of indium on the lower cladding layer, and an upper cladding layer. Another embodiment is a method of manufacturing light-emitting diodes includes forming a lower cladding layer on a substrate, forming an active layer on the lower cladding layer such that the active layer has a quantum well of thirty percent indium, forming an upper cladding layer on the active layer, and forming a metal cap on the upper cladding layer.

DETAILED DESCRIPTION

The foregoing is not intended to be an exhaustive list of embodiments and features of the present inventive concept. Persons skilled in the art are capable of appreciating other embodiments and features from the following detailed description in conjunction with the drawings.

New LEDs may be produced from processes using a III-V compound substrate on which is grown a number of layers by a process such as molecular beam epitaxy (MBE) or metal-organic chemical vapor deposition (MOCVD). By changing the composition of the III-V compound semiconductor layers and the typical layer structure one can produce arrays of LEDs that can attain a 1.0 to 1.1 µm bandwidth.

The LED is produced from a III-V compound substrate on which is grown a number of layers by a process such as molecular beam epitaxy (MBE) or metal-organic chemical vapor deposition (MOCVD). A "III-V" compound refers to a compound having an element from group III on the Periodic Table of the Elements, a metallic element, and an element from group V on the Periodic Table, a nonmetallic element. One common example compound used in manufacture of LEDs is gallium (Ga) arsenide (As).

Figure 1:
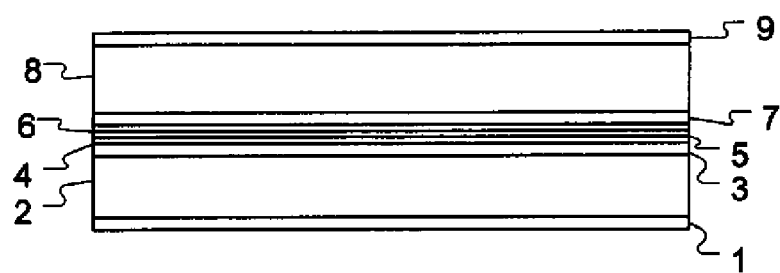
FIG. 1 shows an embodiment of a LED layered structure.

A layered LED structure is shown in FIG. 1. It must be noted that these structures have several layers, numbered consecutively. No such limitation is intended nor should it be implied. These are exemplary structures and are merely used as means to promote understanding of the embodiments.

In one embodiment, the LED layered structure has a quantum well in the active layer, with no strain compensation. The compositions of the layers are shown in the table below, with layer 5 being the active layer.

| Layer Number | Material Type | Composition (x) | Thickness (µm) | Doping Level | Type | Dopant |
|---|---|---|---|---|---|---|
| 9 | GaAs | | 0.1 | $1 \times 10^{19}$ | p++ | Zn |
| 8 | Al(x)Ga(1 − x)As | 0.3 | 4.0 | $6 \times 10^{18}$ | p+ | Zn |
| 7 | Al(x)Ga(1 − x)As | 0.0-0.3 grade | 0.2 | $3 \times 10^{18}$ | p+ | Zn |
| 6 | GaAs | | 0.05 | | | |
| 5 | In(x)Ga(1 − x)As | 0.3 | 90 Å | | | |
| 4 | GaAs | | 0.05 | | | |
| 3 | Al(x)Ga(1 − x)As | 0.7-0.0 grade | 0.2 | $3 \times 10^{18}$ | n+ | Si |
| 2 | Al(x)Ga(1 − x)As | 0.7 | 1.8 | $3 \times 10^{18}$ | n+ | Si |
| 1 | GaAs | | 0.2 | $3 \times 10^{18}$ | n+ | Si |

In the above embodiment, the strained quantum well is designed to have peak photoluminescence (PL) at 1070 nm±5 nm. The gallium arsenide substrate is 2° off (100) n+Si 1-4× $10^{18}$. Combinations of the layers on either side of the active layer, such as layers 2-4 and 7-9, either alone or in other combination, may be referred to as upper and lower cladding layers. The active layers, such as layers 4-6, alone or in combination may be referred to as the active layer, event though the active layer may comprise several layers.

If a standard LED layer is used, the level of strain in the quantum well is such that it approaches the critical layer thickness for the quantum well and this will cause difficulty in the reliability of this device. Adjusting the layer thickness of the quantum well and the amount of the indium concentration in the well allows tailoring of the peak emission wavelength in the 0.98 to 1.07 μm as required. However, for wavelengths approaching 1.1 μm difficulties in the critical layer thickness and indium concentration lead to problems in achieving the desired peak wavelength.

As an added feature of this embodiment, the bottom cladding layer, layer 2 in the above table, has a higher concentration of aluminum than the top cladding layer, layer 8 in the above table. This reduces the refractive index and acts as guide reflecting some emitted light back into the active, out of the sides of the chip and out of the top of LED die. All of this light contributes to the total light output from the light emitting diode, increasing the efficiency of the LED, which is generally the intensity of the light or number of photons produced for a given applied current, or number of electrons introduced, to the p-n junction forming the diode.

In another embodiment, the layers are manufactured as above, with the addition of a Bragg reflector, or Bragg stack, into the layers.

| Layer Number | Material Type | Composition (x) | Thickness (μm) | Doping Level | Type | Dopant |
|---|---|---|---|---|---|---|
| 11 | GaAs | | 0.1 | $1 \times 10^{19}$ | p++ | Zn |
| 10 | Al(x)Ga(1 − x)As | 0.3 | 4.0 | $6 \times 10^{18}$ | p+ | Zn |
| 9 | Al(x)Ga(1 − x)As | 0.0-0.3 grade | 0.2 | $3 \times 10^{18}$ | p+ | Zn |
| 8 | GaAs | | 0.05 | | | |
| 7 | In(x)Ga(1 − x)As | 0.3 | 90 Å | | | |
| 6 | GaAs | | 0.05 | | | |
| 5 | Al(x)Ga(1 − x)As | 0.7-0.0 grade | 0.2 | $3 \times 10^{18}$ | n+ | Si |
| 4 | In(x)Ga(1 − x)As | 0.11 | 0.075 | $3 \times 10^{18}$ | n+ | Si |
| 3 | In(x)Al(1 − x)As | 0.1 | 0.089 | $3 \times 10^{18}$ | n+ | Si |
| 2 | Al(x)Ga(1 − x)As | 0.7 | 1.8 | $3 \times 10^{18}$ | n+ | Si |
| 1 | GaAs | | 0.2 | $3 \times 10^{18}$ | n+ | Si |

Figure 2:
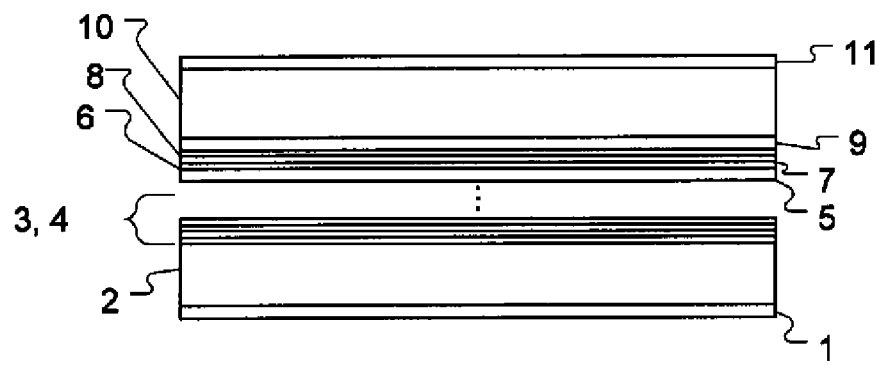
FIG. 2 shows an embodiment of a LED layered structure having a Bragg reflector.

In the above embodiment, layers 3 and 4 repeat. In a specific example, layer 3 may repeat 25 times and layer 4 may repeat 24 times, forming the Bragg stack. This is shown in FIG. 2.

The LED generates infra-red illumination in the active layer but may emit light along a path normal, or close to normal, to the perpendicular of the chip. The substrate or bottom contact typically absorbs this illumination. The addition of a Bragg stack will act as a reflector for these photons and a typical photon will then be emitted from the top surface of the die.

The addition of this Bragg stack used in the manufacture of surface emitting laser diodes will improve the quantum efficiency for LEDs. The efficiency is generally the amount of photons emitted by the LED chip divided by the number of electrons injected into the active region, by approximately 30%. This has benefits in the amount of light generated by the chip and reduces the amount of excess heat generated improving the reliability and performance of these devices.

Figure 3:
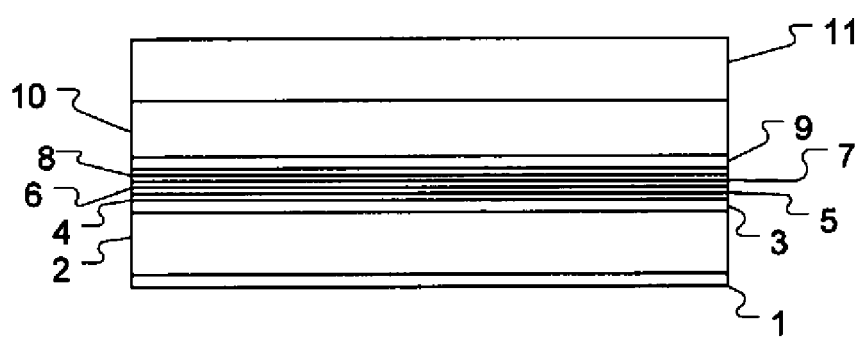
FIG. 3 shows an embodiment of a LED layered structure having strain compensation.

In the above embodiments, the quantum well did not have any strain compensation. Strain occurs in the quantum wells due to the thickness of the layers and their compressive stress. In strain compensation, layers with tensile stress are introduced on either side of the compressively strained quantum well layer. This compensates for the compressive stress and increases the barrier heights. An example structure is shown in FIG. 3, with the layers being comprised as shown in the below table.

| Layer Number | Material Type | Composition (x) | Thickness (μm) | Doping Level | Type | Dopant |
|---|---|---|---|---|---|---|
| 11 | GaAs | | 3.0 | $1 \times 10^{19}$ | p++ | Zn |
| 10 | Al(x)Ga(1 − x)As | 0.3 | 3.0 | $2 \times 10^{18}$ | p+ | Zn |
| 9 | Al(x)Ga(1 − x)As | 0.0-0.3 grade | 0.2 | $2 \times 10^{18}$ | p+ | Zn |
| 8 | GaAs(1 − x)P(x) | 0.07 | 240 Å | | | |
| 7 | In(x)Ga(1 − x)As | 0.3 | 65 Å | | | |
| 6 | GaAs(1 − x)P(x) | 0.07 | 240 Å | | | |
| 5 | In(x)Ga(1 − x)As | 0.3 | 65 Å | | | |
| 4 | GaAs(1 − x)P(x) | 0.77 | 240 Å | | | |
| 3 | Al(x)Ga(1 − x)As | 0.7-0.0 grade | 0.2 | $3 \times 10^{18}$ | n+ | Si |
| 2 | Al(x)Ga(1 − x)As | 0.7 | 1.8 | $3 \times 10^{18}$ | n+ | Si |
| 1 | GaAs | | 0.2 | $3 \times 10^{18}$ | n+ | Si |

In this embodiment, barrier layers of GaAsP are introduced. The layers provide a partial compensation for the compressively strained quantum well and increase the barrier heights. Phosphorous is used in this example, but other elements may be used in its place. This eliminates any issues with the thickness of the quantum well, as the strain compensation at least partially neutralizes the stresses that may cause defects in the layers that result in device failure.

The above structure may or may not include the Bragg stack discussed above. No limitation to these particular layers is intended, nor should it be implied.

Adjusting the thickness and percentage of Indium in the quantum well and making a corresponding compensating change to the GaAsP barriers, it is possible to adjust the peak wavelength of the Light Emitting Diode anywhere in the 1.0 to 1.1 μm band.

Figure 4:
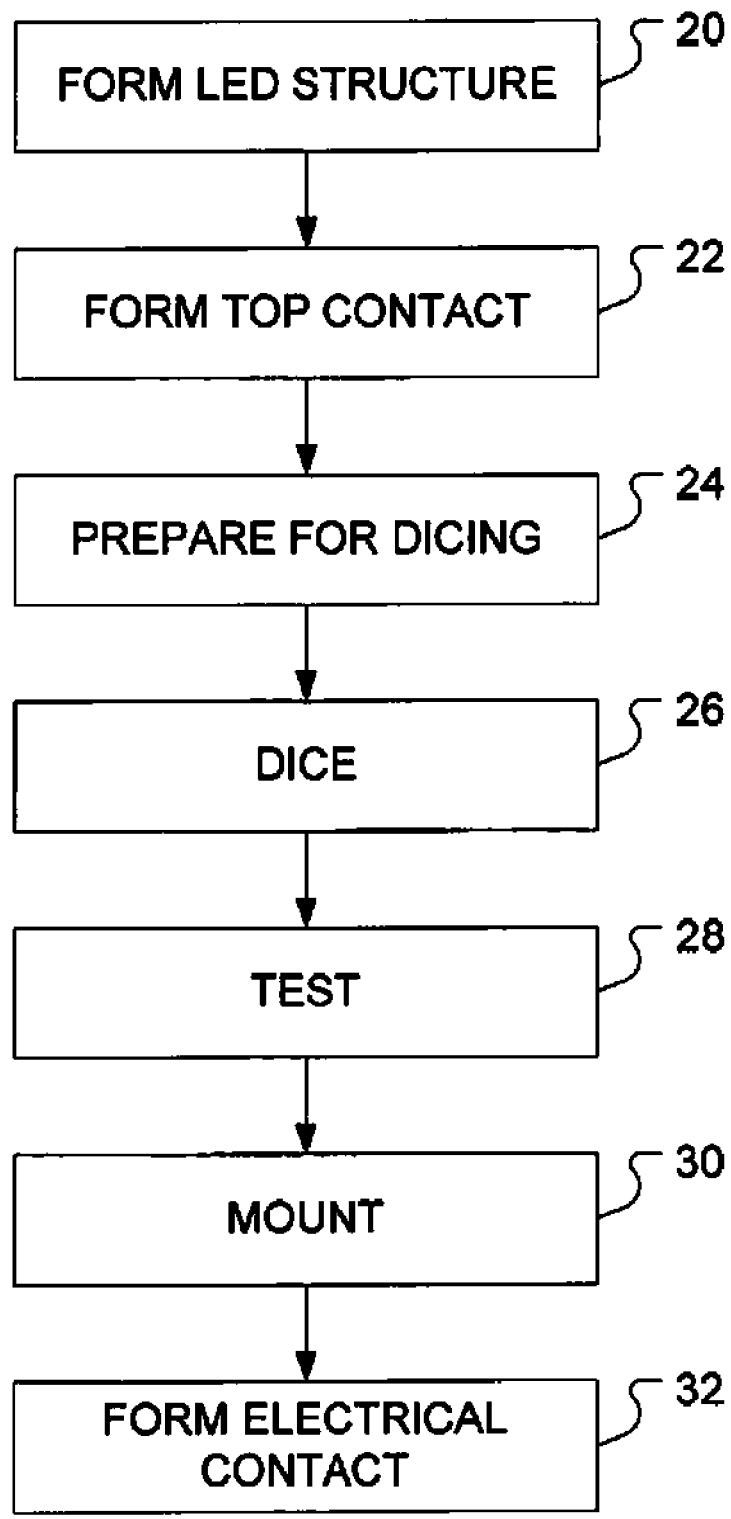
FIG. 4 shows an embodiment of a process for fabricated an LED structure.

Using these layers, normally used in laser diodes, it is possible to manufacture LED arrays that produce wavelengths in the desired bands. A process for manufacture is shown in FIG. 4.

The LED structure is formed at 20, for example, as discussed above. For example, the structure is formed with a higher than normal concentration of Indium in the quantum well, upwards of 30%. A Bragg reflector may or may not be included with that structure. Alternatively, the device may include strain compensation in the form of cladding layers having tensile stress.

Figure 5:
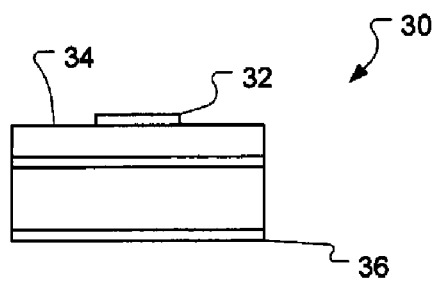
FIG. 5 shows an embodiment of an LED from a side view.

A top contact is formed at 22. The top contact is generally a 'cap' of metal, such as titanium-platinum-gold, (TiPtAu), is formed over each LED element. This is shown in FIG. 5, with the GaAs top layer with no metallization at 34, and the cap shown as 32. Generally, the top contact will be formed using a lift-off process, rather than an etch process, due to the multiple layers of metal and gold contact. The use of a TiPtAu cap produces an ohmic, p+ cap.

At 24, the LED carrier upon which the LED structures were formed is prepared for dicing. This may involve thinning the back of the substrate upon which the LED is formed. A back metal, such as gold-germanium-nickel-gold (AuGeNiAu) layer may be deposited, shown at 36 in FIG. 5, and annealed.

The LED carrier is then diced at 26 and the LEDs are tested at 28. Testing may involve voltage testing all of the device and sampling the power and peak wavelengths. All of the devices that pass the testing phase would then be mounted.

Mounting, at 30 in FIG. 4, may involve mounting the die, or multiple die, on blue film. At 32, electrical contacts would be formed between the base of the die using solder or electrically conductive adhesive. A contact is made to the cap using gold or aluminum wire.

In operation, when electrical current is passed through the LED, the LED emits light at the desired spectral wavelength. An LED having the ability to emit light with wavelengths in the 1.0 to 1.1 µm range is new and may be used in many different applications, including semiconductor and MEMS device inspection.

Figure 6:
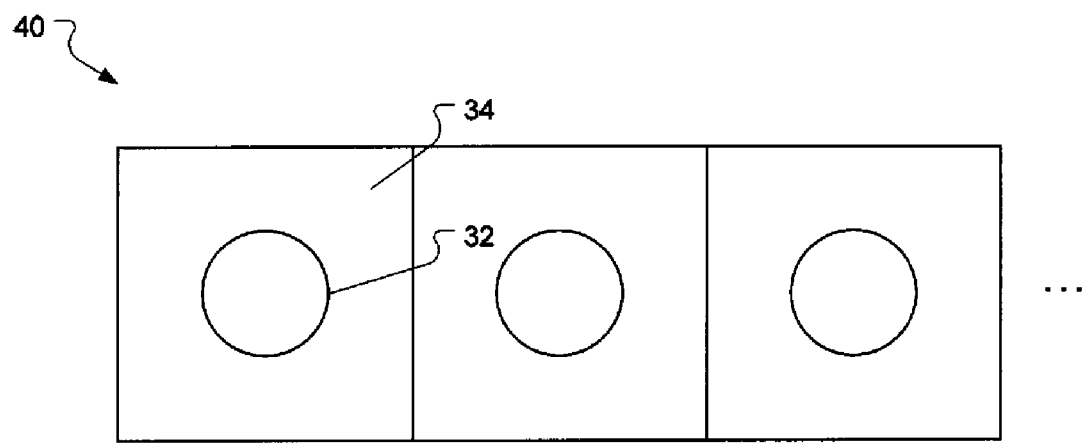
FIG. 6 shows an embodiment of an LED array from a top view.

One such application is in an array of LEDs, as shown in FIG. 6. The top of each LED is shown with its metalized cap 32 formed into an array 40. The use of the different layer compositions discussed above make it possible to manufacture arrays of quantum well LEDs, rather than single laser diodes, to produce light in the desired wavelength.

Exemplary solid-state light sources, systems and applications in which the die contemplated herein may be used in include those set forth in PCT Patent Application PCT/US03/14625, filed May 8, 2003, entitled "High Efficiency Solid-State Light Source and Methods of Use and Manufacture," hereby incorporated by reference in its entirety for all its teachings. PCT Patent Application PCT/US03/14625 discloses, among other things, high-intensity light sources that are formed by a micro array of semiconductor light sources, such as LEDs, laser diodes, or VCSEL placed densely on a substrate to achieve power density output of at least 50 mW/cm$^2$.

Exemplary solid-state light sources, systems and applications in which the die contemplated herein may be used in include those include those disclosed by U.S. patent application Ser. No. 11/109,903, filed Apr. 19, 2005, entitled "Imaging Semiconductor Structures Using Solid State Illumination," which is hereby incorporated by reference. U.S. patent application Ser. No. 11/109,903 discloses, among other things a solid state light source that irradiates selected semiconductor structures via a fiber optic light guide and a lens system. The source's radiation is directed to structures via an internal beam splitter in the lens system. The radiation, so directed, generally is reflected by structures at various intensities (e.g., depending on the bond characteristics and other features and defects of the semiconductor structures), so as to travel back up through the lens system, to a camera, such camera being based on or using one or more solid state imaging devices, e.g., CCD or CMOS detectors.

The camera preferably detects such reflected radiation of one or more wavelengths. Via such detection, an image of the structures is captured. The image, so captured, may be provided for further processing via, e.g., computer The captured image, so processed or otherwise, may be employed for test and quality control, toward identifying relevant features of such structures e.g., where such relevant features are associated with bonded or stacked layers (e.g., in the interfacing layer(s) of bonded or stacked substrates or in the bond itself) or with other bonded or stacked materials.

U.S. Pat. No. 6,995,405, by Braddell, et al, granted Feb. 7, 2006, entitled "Illuminator", is hereby incorporated by reference.

Persons skilled in the art will recognize that many modifications and variations are possible in the details, materials, and arrangements of the parts and actions which have been described and illustrated in order to explain the nature of this inventive concept and that such modifications and variations do not depart from the spirit and scope of the teachings and claims contained therein.

What is claimed is:

1. A light-emitting diode, comprising:
   a substrate;
   a lower cladding layer;
   an active layer having a quantum well without strain compensation of a thirty percent concentration of indium on the lower cladding layer; and
   an upper cladding layer having a lower concentration of metal than the lower cladding layer.

2. The light-emitting diode of claim 1, further comprising a Bragg stack between the lower cladding layer and the active layer.

3. The light-emitting diode of claim 2, wherein the Bragg stack comprises alternating layers of indium-gallium-arsenide and indium-aluminum-arsenide.

4. The light-emitting diode of claim 1, further comprising a strain-compensating layer between the active layer and the lower cladding layer.

5. The light-emitting diode of claim 4, wherein the strain-compensating layer further comprises a layer of indium-gallium-arsenide-phosphorous.

6. The light-emitting diode of claim 1, further comprising a strain-compensating layer between the active layer and the upper cladding layer.

7. The light-emitting diode of claim 1, further comprising a top metal layer residing on a selective portion of the upper cladding layer.

8. The light-emitting diode of claim 1, further comprising a metal layer adjacent the substrate on a side opposite the lower cladding layer.

9. The light-emitting diode of claim 1, wherein the active layer emits light having a wavelength in a range of 1.0 to 1.1 micrometers.

10. A light-emitting diode, comprising:
    a substrate;
    a lower cladding layer;
    an active layer having a quantum well of a thirty percent concentration of indium on the lower cladding layer;
    barrier layers having tensile stress on either side of the quantum well; and
    an upper cladding layer having a lower concentration of metal than the lower cladding layer.

* * * * *